(12) United States Patent
Howland et al.

(10) Patent No.: US 6,741,093 B2
(45) Date of Patent: May 25, 2004

(54) METHOD OF DETERMINING ONE OR MORE PROPERTIES OF A SEMICONDUCTOR WAFER

(75) Inventors: William H. Howland, Wexford, PA (US); Robert J. Hillard, Avalon, PA (US)

(73) Assignee: Solid State Measurements, Inc., Pittsburgh, PA (US)

(*) Notice: Subject to any disclaimer, the term of this patent is extended or adjusted under 35 U.S.C. 154(b) by 95 days.

(21) Appl. No.: 10/100,437

(22) Filed: Mar. 18, 2002

(65) Prior Publication Data

US 2002/0180474 A1 Dec. 5, 2002

Related U.S. Application Data

(63) Continuation-in-part of application No. 09/692,659, filed on Oct. 19, 2000, now Pat. No. 6,492,827.
(60) Provisional application No. 60/278,548, filed on Mar. 23, 2001.

(51) Int. Cl.$^7$ .............................................. G01R 31/02
(52) U.S. Cl. ...................................................... 324/765
(58) Field of Search .................................. 324/716, 719, 324/765–767, 769; 438/14–18; 257/40–48

(56) References Cited

U.S. PATENT DOCUMENTS 5,023,561 A * 6/1991 Hillard ........................ 324/719
5,767,691 A * 6/1998 Verkuil ........................ 324/761

OTHER PUBLICATIONS

"MOS (Metal Oxide Semiconductor) Physics and Technology" by E.H. Nicollian and J.R. Brews—pp. 61–63; Copyright 1982 by Bell Telephone Laboratories, Incorporated, (month unavailable).

* cited by examiner

*Primary Examiner*—Vinh P. Nguyen
(74) *Attorney, Agent, or Firm*—Webb Ziesenheim Logsdon, Orkin & Hanson, P.C.

(57) ABSTRACT

A product semiconductor wafer has integrated circuits separated by scribe lines. A probe having an elastically deformable, electrically conductive tip is moved into contact with one of the scribe lines thereby forming a test structure. A suitable electrical stimulus is applied to the test structure and a response of the test structure to the electrical stimulus is measured. At least one property of the product semiconductor wafer is determined from the response.

19 Claims, 3 Drawing Sheets

METHOD OF DETERMINING ONE OR MORE PROPERTIES OF A SEMICONDUCTOR WAFER

CROSS REFERENCE TO RELATED APPLICATIONS

This application claims priority from U.S. Provisional Patent Application Serial No. 60/278,548, filed Mar. 23, 2001, and is a continuation-in-part of U.S. patent application Ser. No. 09/692,659, filed Oct. 19, 2000 now U.S. Pat. No. 6,492,827.

BACKGROUND OF THE INVENTION

1. Field of the Invention

The present invention relates to measuring electrical properties of a product semiconductor wafer.

2. Description of Related Art

The performance of a MOS transistor is dependent on its threshold voltage ($V_T$). Device $V_T$ is highly sensitive to both device geometry and processing. However, processing related parameters have a stronger impact on device $V_T$ and will continue to dominate for all sub-micron technologies. Therefore, highly sensitive and repeatable process measurements are and will continue to be essential in controlling device $V_T$.

Among the various process related parameters, $V_T$ is most sensitive to carrier density profile in the channel region of a MOS transistor. Ion implantation into the channel region is used to produce the channel profile since it allows precise adjustment of $V_T$.

In today's semiconductor wafers, the gate equivalent oxide thickness has decreased to as low as 15 angstroms. Hence, a higher channel doping level is required in order to maintain $V_T$ at an appropriate level and to control off-state leakage and to improve gate control of the channel charge. This makes tight control of $V_T$ more critical and, hence, more difficult.

Currently, monitor wafers are used to measure $V_T$ whereupon the measured value of $V_T$ can be utilized to adjust the ion implant of the channel regions of a product wafer. However, since the ion implant of channels and, hence, the resultant $V_T$ of these channels can vary from semiconductor wafer to semiconductor wafer, it is becoming increasingly necessary to measure $V_T$ on product wafers. In order to measure $V_T$ on product wafers, the measuring means must be non-contaminating, non-damaging, fast, and capable of measuring $V_T$ in product wafer scribe lines or test volumes. However, no means presently exist for measuring $V_T$ and, more particularly, ion implant in a product semiconductor wafer or variances in ion implants between two or more product wafers that meets all of these criteria.

It is, therefore, an object of the present invention to overcome the above problems and others by providing a method for measuring the ion implant of a semiconductor wafer. It is an object of the present invention to provide a method of determining variances in ion implant between two or more semiconductor wafers. Still other objects will become apparent to those of ordinary skill in the art upon reading and understanding the following detailed description.

SUMMARY OF THE INVENTION

Accordingly, we have invented a method of determining one or more properties of a semiconductor wafer having a dielectric layer overlaying at least a portion thereof. The method includes providing a semiconductor wafer having a pattern of integrated circuits formed thereon and scribe lines separating the integrated circuits from one another. A probe is provided having an elastically deformable, electrically conductive tip. The probe tip is caused to contact a dielectric layer overlaying at least a portion of one of the scribe lines of the semiconductor wafer thereby forming a metal-oxide-semiconductor (MOS) structure. The probe tip has a contact area that is received within said scribe line when the probe tip contacts the dielectric layer. A capacitance-voltage (CV), current-voltage (IV), conductance-voltage (GV) or capacitance-time (Ct) type electrical stimulus is applied to the MOS structure. A response of the MOS structure to the electrical stimulus is measured and from the response at least one property of the dielectric layer, the semiconductor wafer and/or the interface therebetween is determined. The probe contacts the dielectric layer with a force whereby the probe tip elastically deforms within its elastic limits.

The semiconducting material comprising the semiconductor wafer can include an ion implanted dopant received in a test volume underlying the dielectric layer contacted by the probe tip.

When a CV type electrical stimulus is applied, the step of applying the stimulus includes the steps of superimposing an AC voltage on a DC voltage and sweeping the DC voltage between a first, starting voltage and a second, ending voltage. The step of measuring the response includes the step of acquiring capacitance values during the sweep of the DC voltage. The determining step includes the step of determining a dopant concentration in at least one layer of the test volume as a function of the acquired capacitance values and the voltage at which each capacitance value is acquired. A dopant implant dose can be determined in the test volume as a function of the dopant concentration in a plurality of layers of the test volume. The plurality of layers extend from adjacent the surface of the test volume in a direction into the test volume away from the surface.

The method can further include determining from the acquired capacitance values a minimum capacitance value ($C_{min}$) of the test volume. The value for $C_{min}$ occurs when the test volume is depleted of majority carriers and a net recombination of majority carriers and minority carriers in or adjacent the test volume is at equilibrium. From the value for $C_{min}$, a maximum space-charge depth of the test volume is determined. The maximum space-charge depth is a distance from the surface of the test volume where the depleted majority carriers reside when the test volume is at equilibrium. An average doping concentration in the test volume can then be determined from the maximum space-charge depth. A threshold voltage value $V_T$ can also be determined from the acquired capacitance values.

Comparisons of average doping concentrations of a reference semiconductor wafer and one or more semiconductor wafers under test can be utilized to determine if an ion implant process for the semiconductor wafers under test is varying outside of an acceptable tolerance.

We have also invented a method of determining one or more properties of a semiconductor wafer that includes providing a semiconductor wafer having a pattern of integrated circuits formed thereon and scribe lines separating the integrating circuits from one another. A probe is provided having an elastically deformable, electrically conductive tip. The probe tip is caused to contact at least a portion of one of the scribe lines of the semiconductor wafer. The probe tip has a contact area that is received within the scribe line. An electrical stimulus is applied between the probe tip and the semiconductor wafer and the response of the semiconductor wafer to the electrical stimulus is measured. From the response, at least one property of the semiconductor wafer is determined.

The probe tip can contact the semiconducting material comprising the semiconductor wafer or a dielectric layer overlaying the semiconducting material comprising the semiconductor wafer. The applied electrical stimulus can be a CV type electrical stimulus and the measured response can include acquiring capacitance values during application of the CV type electrical stimulus.

The semiconducting material comprising the semiconductor wafer can include an ion implanted dopant received in a test volume underlying the contact between the probe tip and the semiconductor wafer. When the probe tip contacts the dielectric layer overlaying the semiconductor material comprising the semiconductor wafer, the determining step includes the step of determining a dopant concentration in at least one layer of the test volume as a function of the acquired capacitance values.

BRIEF DESCRIPTION OF THE DRAWINGS

FIG. 3b is a plot derived from the capacitance versus voltage plot shown in FIG. 3a;

DETAILED DESCRIPTION OF THE INVENTION

Figure 1:
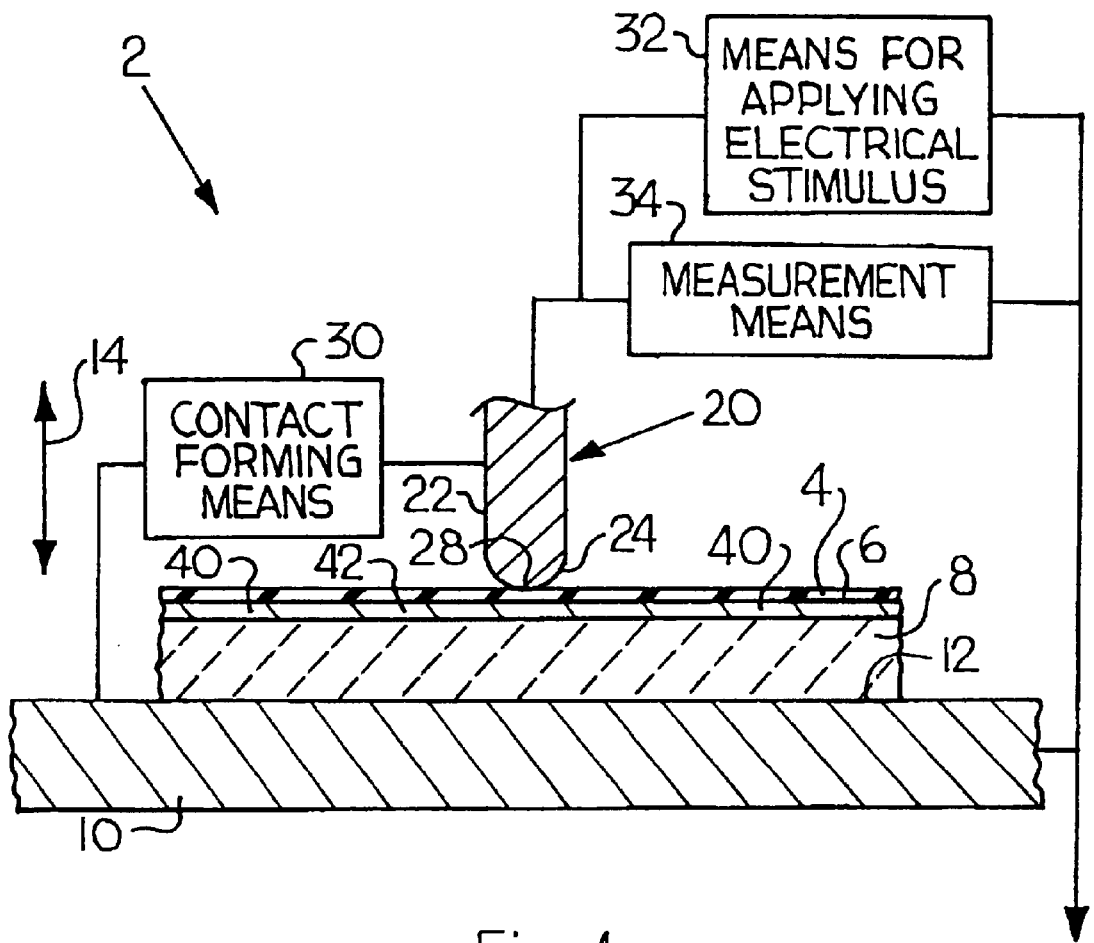
FIG. 1 is a cross sectional side view of a conductive probe contacting a scribe line of a patterned semiconductor wafer having an overlaying dielectric layer and a test volume formed in the scribe line.

With reference to FIG. 1, an apparatus 2 for measuring an implant dose or an implant concentration of a semiconductor wafer 8 having an overlaying dielectric layer 4 includes a vacuum chuck 10 which holds a back surface 12 of semiconductor wafer 8 by means of vacuum. Preferably, chuck 10 is moveable vertically up and down as shown by arrow 14 in FIG. 1.

Apparatus 2 also includes a probe 20 having a shaft 22 with a conductive tip 24 at one end thereof. Probe 20 is also moveable vertically up and down as shown by arrow 14. A contact forming means 30, of the type well known in the art, controls the vertical movement of chuck 10 and/or probe 20 to move probe 20 and semiconductor wafer 8 toward each other whereupon distal end 28 of conductive tip 24 presses into contact with dielectric layer 4. This joining of conductive tip 24 and dielectric layer 4 forms a first contact between conductive tip 24 and semiconductor wafer 8. Contact between back surface 12 and chuck 10 forms a second contact with semiconductor wafer 8.

A means for applying electrical stimulus 32 and a measurement means 34 are connected in parallel between conductive tip 24 and chuck 10. Chuck 10 is typically connected to a reference ground. However, this is not to be construed as limiting the invention since chuck 10 can alternatively be connected to an AC or DC reference bias.

Conductive tip 24 is formed from an elastically deformable material such as a smooth, highly polished metal, e.g., tantalum, a conductive elastomer or a conductive polymer. Conductive tip 24 preferably has a hemispherical shape having a radius of curvature between 10 micrometers and 100 centimeters. However, this is not to be construed as limiting the invention.

Figure 2:
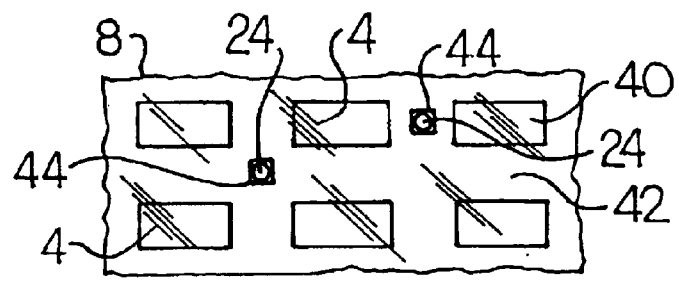
FIG. 2 is an isolated perspective view of a portion of a patterned semiconductor wafer with probe tips contacting scribe lines having a dielectric layer overlaying test volumes formed in the scribe lines.

With reference to FIG. 2, and with continuing reference to FIG. 1, in accordance with the present invention, if semiconductor wafer 8 is a product semiconductor wafer, semiconductor wafer 8 includes a pattern of integrated circuits 40 separated by scribe lines 42 in a manner known in the art. During fabrication of integrated circuits 40, one or more select volumes of each integrated circuit 40 are ion implanted with a suitable dopant which creates a potential difference between each of these volumes and the bulk semiconducting material surrounding each of these implanted volumes.

In accordance with the present invention, during ion implant of the select volumes of each integrated circuit 40, one or more test volumes 44 of semiconductor wafer 8 are also ion implanted. Each test volume 44 is formed in one of the scribe lines 42 between two integrated circuits 40 or at the intersection of two transverse scribe lines 42. At a suitable time during processing of semiconductor wafer 8, dielectric layer 4 is formed over the top surface of each test volume 44. Dielectric layer 4 can be simultaneously formed over test volumes 44 and integrated circuits 40 or can be formed over test volumes 44 and integrated circuits 40 at different times.

In FIG. 2, the outline of conductive tip 24 of probe 20 is shown received on the surface of dielectric layer 4 overlaying each test volume 44. The mechanical contact area between conductive tip 24 of probe 20 and dielectric layer 4 overlaying each test volume 44 can be determined by the well-known Hertzian formula related to elastic contacts between spherical and flat bodies.

It is well known that dopant ions implanted into semiconductor wafer 8 come to rest at different depths from top surface 6 of semiconductor wafer 8 based upon, among other things, the kinetic energy of each ion striking semiconductor wafer 8 and the crystal structure where each ion impacts semiconductor wafer 8. As a result, the ion concentration, i.e., ions/cm$^3$, of each layer of semiconductor wafer 8 from top surface 6 will vary. In the processing of product semiconductor wafers, it is desirable to determine implant dose, i.e., ions/cm$^2$, in order to ensure that integrated circuits formed on the semiconductor wafer will perform in a desired manner. Moreover, with today's large diameter, i.e., 300 millimeter, semiconductor wafers, it is desirable to ensure that integrated circuits formed on the semiconductor wafer have been ion implanted within an acceptable tolerance regardless of where each integrated circuit resides on the semiconductor wafer.

In order to determine the implant dose of integrated circuits 40 formed on semiconductor wafer 8, use is made of the ion implanted test volumes 44 formed in scribe lines 42 or at the intersection of transverse scribe lines 42 in semiconductor wafer 8. To this end, conductive tip 24 of probe 20 is brought into contact with dielectric layer 4 overlaying each ion implanted test volume 44. While a single probe 20 can be utilized to sequentially determine the implant dose of each test volume 44 of semiconductor wafer 8, multiple probes 20 coupled to a common test fixture (not shown) can be utilized to acquire from multiple test volumes 44 data from which the implant dose of each test volume can be determined. The acquisition of data and the determination of implant dose from one test volume 44 will now be described with reference to FIGS. 3a–3c, and with continuing reference to FIGS. 1 and 2. It is to be appreciated, however, that the acquisition of data and the determination of implant dose in each test volume 44 of semiconductor wafer 8 occurs in the same manner.

Initially, contact forming means 30 causes conductive tip 24 to contact dielectric layer 4 overlaying ion implanted test volume 44 of semiconductor wafer 8 thereby forming a MOS test structure. More specifically, the combination of conductive tip 24, dielectric layer 4 and semiconductor wafer 8 forms the MOS test structure. Once this MOS test structure is formed, means for applying electrical stimulus 32 applies a suitable capacitance-voltage (CV), current-voltage (IV), conductance-voltage (GV) or capacitance-time (Ct) type electrical stimulus to this MOS test structure. For purposes of the following description, means for applying electrical stimulus 32 will be described as applying a CV type electrical stimulus. However, this is not to be construed as limiting the invention.

Figure 3A:
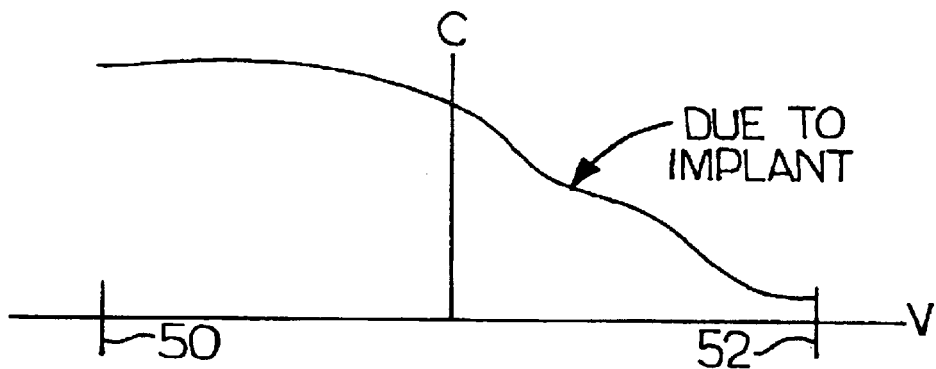
FIG. 3a is a capacitance versus voltage plot of a test volume and dielectric layer acquired utilizing the conductive probe shown in FIG. 1.

Means for applying electrical stimulus 32 applies to the MOS test structure a CV type electrical stimulus comprising an AC voltage superimposed on a DC voltage which is swept from a first, starting voltage 50 to a second, ending voltage 52. During the sweep of the DC voltage, capacitance values of the MOS test structure are acquired. An exemplary plot of acquired capacitance values versus voltage is shown in FIG. 3a.

Figure 3B:
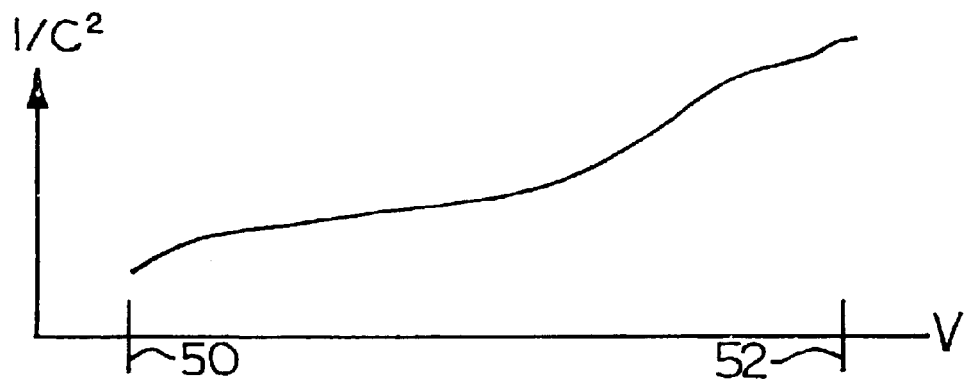

Next, the inverse of the acquired capacitance values squared, i.e., $1/C^2$, versus voltage is determined. A plot of $1/C^2$ versus voltage is shown in FIG. 3b.

Next, the following equation 1 is utilized to determine the implant concentration $N_w$ for values of $1/C^2$ between starting voltage 50 and ending voltage 52.

$$EQ\ 1: \frac{-d(1/c^2)}{dV} = \frac{2}{q\varepsilon_s N_w A^2}$$

Where
 q=election charge;
 $\varepsilon_s$=permittivity of semiconductor wafer 8;
 $N_w$=dopant implant concentration; and
 A=contact area of conductive tip 24.

The following equation 2 is then utilized to determine for each value of $N_w$, a distance W from top surface 6 of semiconductor wafer 8 where each implant concentration resides.

$$EQ\ 2: W = \sqrt{\frac{2\varepsilon_s \Psi}{qN_w}}$$

Where
 W=distance from top surface 6 of semiconductor wafer 8; and
 $\Psi$=portion of DC voltage dropped across semiconductor wafer 8 from top surface 6 to a depth L, discussed hereafter.

Figure 3C:
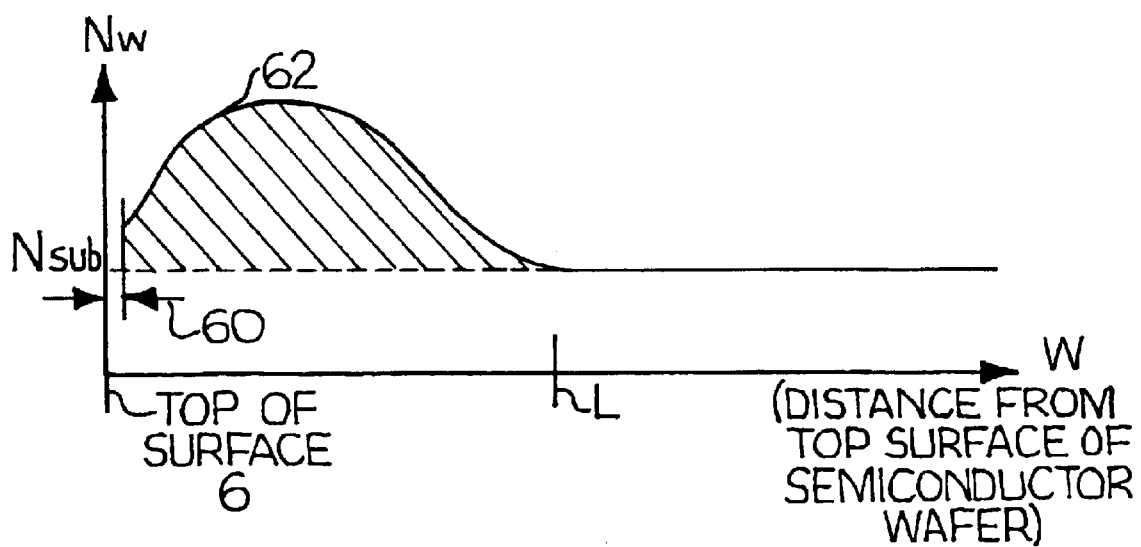
FIG. 3c is a plot of implant dopant concentration of the test volume determined from the plot shown in FIG. 3b.

A plot of $N_w$ versus distance W is shown in FIG. 3c. As can be seen in FIG. 3c, the implant concentration does not have a determinable value for a distance 60 from top surface 6 of semiconductor wafer 8. As further seen in FIG. 3c, the dopant concentration increases with increasing distance W from top surface 6 of semiconductor wafer 8 until it reaches a peak value 62. Thereafter, with further increasing distance W from top surface 6, the dopant concentration decreases until it reaches a steady state value $N_{sub}$ at a distance L from top surface 6. The value of $N_{sub}$ is indicative of residual ions trapped in semiconductor wafer 8 during growing of the ingot from which semiconductor wafer 8 was extracted.

The position of peak value 62 of $N_w$, versus W can be adjusted toward or away from top surface 6 of semiconductor wafer 8 by adjusting the depth to which the dopant ions are implanted into semiconductor wafer 8. For example, dopant ions implanted closer to top surface 6 will cause peak value 62 to shift toward the $N_w$ axis in FIG. 3c while dopant ions implanted further away from top surface 6 will cause peak value 62 to shift away from the $N_w$ axis in FIG. 3c. Thus, by utilizing equations 1 and 2 to determine $N_w$ versus W, the location and magnitude of peak value 62 of $N_w$, can be accurately determined and, thereby, controlled. Since control of the location and magnitude of peak value 62 of $N_w$ is directly related to the voltage threshold $V_T$ of MOS field effect transistors (MOSFETs), the ability to accurately determine the location and magnitude of peak value 62 of $N_w$ is important in determining whether semiconductor wafer 8 has been implanted within an acceptable tolerance.

The dopant implant dose, also referred to as the partial implant dose PID, of each test volume can be determined from the following equation 3:

$$EQ\ 3: PID = \int_{Top\ Surface}^{L} [N_w(X) - N_{sub}]dx$$

where
 $N_{sub}$=residual dopant concentration in the semiconducting material forming semiconductor wafer 8, and
 PID=dopant implant dose.

The determination of dopant implant dose can be compared to a theoretical dopant implant dose for test volume 44 to determine if the ion implant of dopants in semiconductor wafer 8 is occurring within an acceptable tolerance.

Figure 4:
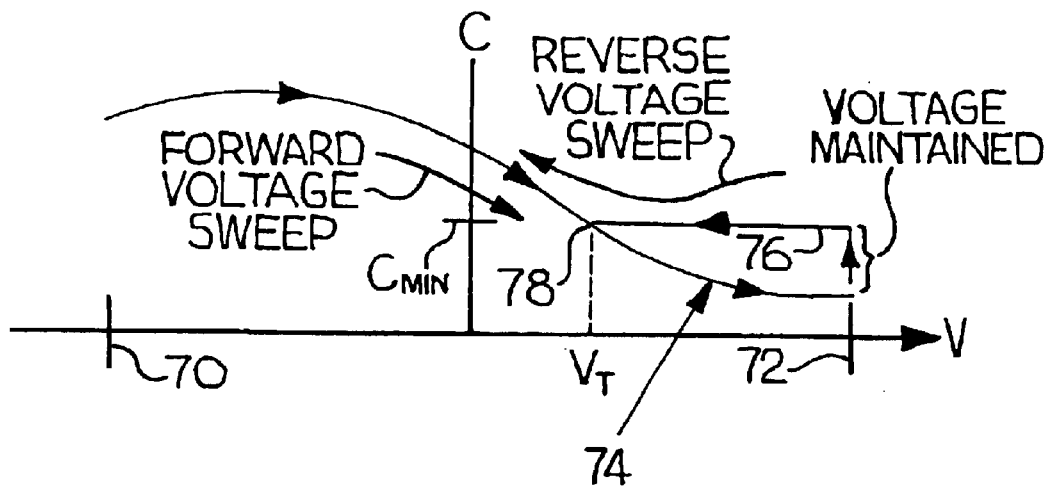
FIG. 4 is a capacitance versus voltage plot for a forward and reverse voltage sweep of a test volume and dielectric layer acquired utilizing the conductive probe shown in FIG. 1.

With reference to FIG. 4, and with continuing reference to FIGS. 1 and 2, it has been determined that it is not always necessary to determine the dopant implant concentration in the various layers of test volume 44 or the dopant implant dose in test volume 44 in order to determine that the implant of ion dopant in test volume 44 is within an acceptable tolerance. To this end, it has been determined that an average surface doping concentration in a test volume 44 can be determined from the value for $C_{min}$ for the test volume 44.

The value of $C_{min}$ for a test volume 44 is determined by applying a CV type stimulus to conductive tip 24. This CV type stimulus includes superimposing an AC signal on a DC signal which is swept from a first, starting voltage 70 to a second, ending voltage 72. The sweep of the DC voltage to ending voltage 72 occurs in a manner whereupon test volume 44 is driven into deep depletion 74. When the DC voltage reaches ending voltage 72, the means for applying electrical stimulus 32 causes the DC voltage to dwell at ending voltage 72. Since test volume 44 has been driven into deep depletion 74, the measured capacitance increases even though the means for applying electrical stimulus 32 maintains ending voltage 72 applied to conductive tip 24. The capacitance of test volume 44 continues increasing until it reaches a steady state value 76. This steady state value 76 occurs when test volume 44 is depleted of majority carriers and the net recombination of majority carriers and minority carriers in or adjacent test volume 44 is at equilibrium. Thereafter, the means for applying electrical stimulus 32 performs a reverse voltage sweep from ending voltage 72 toward starting voltage 70.

During application of the CV type stimulus shown in FIG. 4, measurement means 34 monitors the capacitance of test volume 44 and determines when the capacitance of the reverse voltage sweep initially equals the capacitance of the forward voltage sweep. This capacitance is designated as $C_{min}$ and the voltage corresponding to $C_{min}$ is designated as the threshold voltage $V_T$. The value of $V_T$ can be determined empirically from the CV type stimulus or it can be determined in a manner known in the art from values determined for $C_{min}$ and $N_{surf}$, discussed hereafter.

Utilizing the following equation 4, the maximum space charge distance ($W_M$) from top surface 6 at $C_{min}$ can be determined.

$$EQ\ 4: C_{min} = \frac{\varepsilon_{ox} A}{T_{ox} + (\varepsilon_{ox}/\varepsilon_s) W_m}$$

where $\varepsilon_{ox}$=permittivity of dielectric layer 4;

$\varepsilon_s$=permittivity of semiconductor wafer 8;

$T_{ox}$=thickness of dielectric layer 4;

$W_M$=maximum space charge distance from top surface 6 at $C_{min}$; and

A=contact area of conductive tip 24.

From the thus determined value for $W_M$, an average doping concentration ($N_{surf}$) can be determined utilizing the following equation 5:

$$EQ\ 5: W_m = \sqrt{\frac{2\varepsilon_s \Psi_L}{qN_{surf}}}$$

where $\varepsilon_s$=permittivity of semiconductor wafer 8;

$\Psi_L$=Linder saturation band bending in inversion;

q=election charge; and $N_{surf}$=average doping concentration.

The value of $N_{surf}$ for each semiconductor wafer provides an indication of whether ion implant of the semiconductor wafer 8 is within an acceptable tolerance, but does not provide an absolute indication of dopant concentration or dopant dose in a test volume 44. However, a value of $N_{surf}$ determined for a semiconductor wafer 8 that has been ion implanted within an acceptable tolerance can be compared to values of $N_{surf}$ determined for product semiconductor wafers 8 to determine if these product semiconductor wafers 8 have been ion implanted within the acceptable tolerance. To this end, the value of $N_{surf}$ determined for a reference semiconductor wafer can be compared to the value of $N_{surf}$ for each of one or more product semiconductor wafers under test to determine if the difference in values exceeds a predetermined difference indicative of the ion implant process varying outside of the acceptable tolerance.

Figure 5:
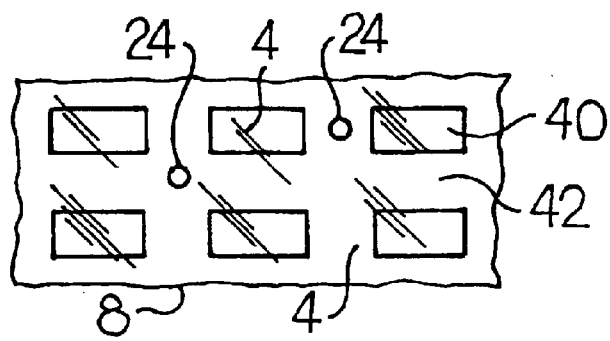
FIG. 5 is an isolated perspective view of a portion of a patterned semiconductor with probe tips contacting scribe lines having a dielectric layer overlaying the bulk semiconducting material forming the semiconductor wafer.

With reference to FIG. 5, and with continuing reference to FIG. 1, in accordance with another embodiment of the present invention, conductive tip 24 of probe 20 can contact dielectric layer 4 overlaying semiconductor wafer 8 in a scribe line 42 thereof. In this embodiment, however, the portion of semiconductor wafer 8 below the contact of conductive tip 24 and dielectric layer 4 does not include an ion implant. The combination of conductive tip 24, dielectric layer 4 and semiconductor wafer 8 forms a MOS test structure to which the means for applying electrical stimulus 32 can apply one or more of a suitable CV type, current-voltage (IV) type, conductance-voltage (GV) and/or capacitance-time (Ct) or lifetime measurement type electrical stimulus. Measurement means 34 can then measure the response of the MOS test structure to the stimulus and determine therefrom one or more properties of dielectric layer 4, semiconductor wafer 8, and/or the interface therebetween in a manner known in the art. In this embodiment, when a CV type electrical stimulus is applied, the measured response can be utilized to determine a value for the residual dopant concentration ($N_{sub}$) in the semiconducting material forming semiconductor wafer 8.

Conductive tip 24 of probe 20 can also contact a dielectric layer overlaying the bulk semiconducting material or an ion implanted test volume 44 of an unpatterned semiconductor wafer, i.e., a semiconductor wafer having no integrated circuits 40 or scribe lines 42 formed thereon, to form a MOS test structure to which CV type, IV type, GV type or Ct type electrical stimulus can be applied. The response of this MOS test structure to the stimulus can be measured and one or more properties of the dielectric layer, the semiconductor wafer, and/or the interface therebetween can be determined from the measured response in a manner known in the art.

Figure 6:
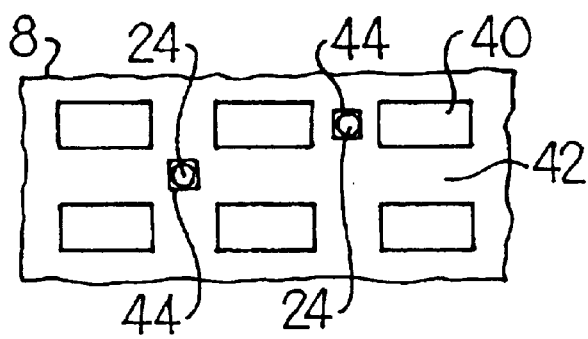
FIG. 6 is an isolated perspective view of a portion of a patterned semiconductor with probe tips contacting the bulk semiconducting material forming the semiconductor wafer in scribe lines where test volumes are formed.
Figure 7:
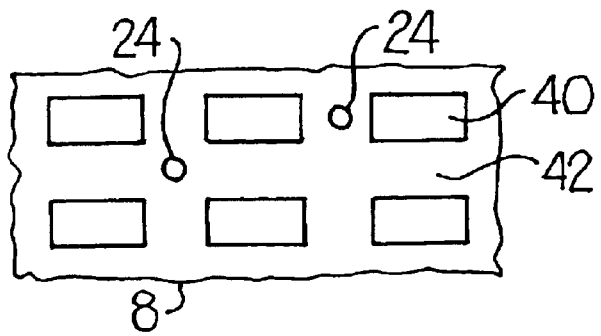
FIG. 7 is an isolated perspective view of a portion of a patterned semiconductor with probe tips contacting the bulk semiconducting material forming the semiconductor wafer in scribe lines.

With reference to FIGS. 6 and 7, in accordance with another embodiment of the present invention, where a scribe line 42 of semiconductor wafer 8 has no overlaying dielectric layer 4, conductive tip 24 of probe 20 can contact the semiconducting material in this scribe line 42 thereby forming a Schottky test structure. The portion of semiconductor wafer 8 forming this Schottky test structure can either be the bulk semiconducting material forming semiconductor wafer 8 or can be a test volume 44 ion implanted with a suitable dopant. Means for applying electrical stimulus 32 can apply a suitable electrical stimulus, e.g., a CV type electrical stimulus, to this Schottky test structure and measurement means 34 can measure the response of the Schottky test structure to the stimulus and determine therefrom one or more properties of semiconductor wafer 8 in a manner known in the art.

Lastly, conductive tip 24 of probe 20 can also contact the bulk semiconducting material or an ion implanted test volume 44 of an unpatterned semiconductor wafer, i.e., a semiconductor wafer having no dielectric layer 4, integrated circuits 40 or scribe lines 42 formed thereon, to form a Schottky test structure to which a suitable electrical stimulus, e.g., a CV type electrical stimulus, can be applied. The response of this Schottky test structure to the stimulus can be measured and one or more properties of semiconductor wafer 8 can be determined from the measured response in a manner known in the art.

As can be seen, the present invention provides a method for determining dopant concentration and dopant dose in scribe lines of a product semiconductor wafer. In addition, the present invention also provides a method for determining whether an ion implant process for a product semiconductor wafer is varying outside of an acceptable tolerance.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method of determining one or more properties of a semiconductor wafer having a dielectric layer overlaying at least a portion thereof, the method comprising the steps of:
   (a) providing a semiconductor wafer having a pattern of integrated circuits formed thereon and scribe lines separating the integrated circuits from one another;
   (b) providing a probe having an elastically deformable, electrically conductive tip;
   (c) causing the probe tip to contact a dielectric layer overlaying at least a portion of one of the scribe lines of the semiconductor wafer thereby forming a metal-oxide-semiconductor (MOS) structure, the probe tip having a contact area that is received within said scribe line when the probe tip contacts the dielectric layer;
   (d) applying an electrical stimulus to the MOS structure;
   (e) measuring a response of the MOS structure to the electrical stimulus; and
   (f) determining from the response at least one property of at least one of the dielectric layer, the semiconductor wafer and the interface therebetween.

2. The method as set forth in claim 1, wherein in step (c) the probe tip elastically deforms within its elastic limits.

3. The method as set forth in claim 1, wherein the semiconducting material comprising the semiconductor wafer includes an ion implanted dopant received in a test volume underlying the dielectric layer contacted by the probe tip.

4. The method as set forth in claim 3, wherein:
   step (d) includes applying a CV type electrical stimulus that comprises superimposing an AC voltage on a DC voltage and sweeping the DC voltage between a first, starting voltage and a second, ending voltage; and
   step (e) includes the step of acquiring capacitance values during the sweep of the DC voltage.

5. The method as set forth in claim 4, wherein step (f) includes the step of determining a dopant concentration in at least one layer of the test volume as a function of the acquired capacitance values and the voltage at which each capacitance value is acquired.

6. The method as set forth in claim 5, wherein step (f) further includes the step of determining a dopant implant dose in the test volume as a function of the dopant concentration in a plurality of layers of the test volume.

7. The method as set forth in claim 6, wherein the plurality of layers extend from adjacent the surface of the test volume in a direction into the test volume away from said surface.

8. The method as set forth in claim 4, wherein step (f) includes the steps of:
   determining from the acquired capacitance values a minimum capacitance value ($C_{min}$) of the test volume, the value for $C_{min}$ occurring when the test volume is depleted of majority carriers and a net recombination of majority carriers and minority carriers in or adjacent the test volume is at equilibrium;
   determining from $C_{min}$ a maximum space-charge depth of the test volume, where the maximum space-charge depth is a distance from the surface of the test volume where the depleted majority carriers reside when the test volume is at equilibrium, and
   determining from the maximum space-charge depth an average surface doping concentration of the test volume.

9. The method as set forth in claim 8, further including the steps of:
   providing another semiconductor wafer having a pattern of integrated circuits formed thereon and scribe lines separating the integrated circuits from one another;
   causing the probe tip to contact a dielectric layer overlaying at least a portion of one of the scribe lines of the other semiconductor wafer thereby forming a metal-oxide-semiconductor (MOS) structure, the probe tip having a contact area that is received within said scribe line when the probe tip contacts the dielectric layer;
   repeating steps (d)–(f) for the other semiconductor wafer; and
   comparing the average surface doping concentrations of the semiconductor wafers.

10. The method as set forth in claim 9, further including the step of:
    determining from the comparison of the average surface doping concentrations whether an ion implant process for the semiconductor wafers is varying outside of an acceptable tolerance.

11. The method as set forth in claim 4, further including the step of determining from the acquired capacitance values a threshold voltage ($V_t$).

12. A method of determining one or more properties of a semiconductor wafer, the method comprising the steps of:
    (a) providing a semiconductor wafer having a pattern of integrated circuits formed thereon and scribe lines separating the integrated circuits from one another;
    (b) providing a probe having an elastically deformable, electrically conductive tip;
    (c) causing the probe tip to contact at least a portion of one of the scribe lines of the semiconductor wafer, the probe tip having a contact area that is received within the scribe line;
    (d) applying an electrical stimulus between the probe tip and the semiconductor wafer;
    (e) measuring a response of the semiconductor wafer to the electrical stimulus; and
    (f) determining from the response at least one property of the semiconductor wafer.

13. The method as set forth in claim 12, wherein in step (c) the probe tip elastically deforms within its elastic limits.

14. The method as set forth in claim 12, wherein the probe tip contacts one of:
    a semiconducting material comprising the semiconductor wafer; and
    a dielectric layer overlaying the semiconducting material comprising the semiconductor wafer.

15. The method as set forth in claim 14, wherein:
    step (d) includes applying a CV type electrical stimulus; and
    step (e) includes acquiring capacitance values during the application of the CV type electrical stimulus.

16. The method as set forth in claim 15, wherein:

the semiconducting material comprising the semiconductor wafer includes an ion implanted dopant received in a test volume underlying the contact between the probe tip and the semiconductor wafer; and when the probe tip contacts the dielectric layer overlaying the semiconducting material comprising the semiconductor wafer, step (f) includes the step of determining a dopant concentration in at least one layer of the test volume as a function of the acquired capacitance values and the voltage at which each capacitance value is acquired.

17. The method as set forth in claim 16, wherein step (f) further includes the step of determining a dopant implant dose in the test volume as a function of the dopant concentration in a plurality of layers of the test volume.

18. The method as set forth in claim 15, wherein:

the semiconducting material comprising the semiconductor wafer includes an ion implanted dopant received in a test volume underlying the contact between the probe tip and the semiconductor wafer; and when the probe tip contacts the dielectric layer overlaying the semiconducting material comprising the semiconductor wafer, step (f) includes the steps of:

determining from the acquired capacitance values a minimum capacitance value ($C_{min}$) of the test volume, the value for $C_{min}$ occurring when the test volume is depleted of majority carriers and a net recombination of majority carriers and minority carriers in or adjacent the test volume is at equilibrium;

determining from $C_{min}$ a maximum space-charge depth of the test volume, where the maximum space-charge depth is a distance from the surface of the test volume where the depleted majority carriers reside when the test volume is at equilibrium; and determining from the maximum space-charge depth an average surface doping concentration.

19. The method as set forth in claim 15, further including the step of determining from the acquired capacitance values a threshold voltage ($V_t$).

* * * * *